(12) United States Patent
Horii

(10) Patent No.: US 12,660,089 B2
(45) Date of Patent: Jun. 16, 2026

(54) COMPOSITE SUBSTRATE AND ELECTRICAL DEVICE

(71) Applicant: NEC Platforms, Ltd., Kawasaki (JP)

(72) Inventor: Yuji Horii, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 515 days.

(21) Appl. No.: 18/275,740

(22) PCT Filed: Jan. 7, 2022

(86) PCT No.: PCT/JP2022/000310
§ 371 (c)(1),
(2) Date: Aug. 3, 2023

(87) PCT Pub. No.: WO2022/172653
PCT Pub. Date: Aug. 18, 2022

(65) Prior Publication Data
US 2024/0107673 A1     Mar. 28, 2024

(30) Foreign Application Priority Data
Feb. 15, 2021     (JP) ................................. 2021-021397

(51) Int. Cl.
*H05K 1/14*         (2006.01)
*H01R 12/79*        (2011.01)
*H05K 7/14*         (2006.01)
(52) U.S. Cl.
CPC ............. *H05K 1/148* (2013.01); *H01R 12/79* (2013.01); *H05K 7/1485* (2013.01)
(58) Field of Classification Search
CPC ....... H05K 1/148; H05K 7/1485; H01R 12/79
(Continued)

(56) References Cited

U.S. PATENT DOCUMENTS

| | | | |
|---|---|---|---|
| 4,700,274 A | 10/1987 | Laut | |
| 2019/0097339 A1* | 3/2019 | Lim | ..................... H01R 12/772 |
| 2019/0126619 A1* | 5/2019 | Kitazawa | ............. H10N 30/802 |

FOREIGN PATENT DOCUMENTS

| | | |
|---|---|---|
| JP | S46-31363 B1 | 9/1971 |
| JP | S52-002252 U | 1/1977 |

(Continued)

OTHER PUBLICATIONS

Taiwanese Office Action for TW Application No. 111101637 mailed on Feb. 6, 2024 with English Translation.

(Continued)

*Primary Examiner* — Andargie M Aychillhum
(74) *Attorney, Agent, or Firm* — Sughrue Mion, PLLC

(57)          ABSTRACT

The purpose of the present invention is to compactly interconnect at least three substrates with flat cables. A composite substrate according to the present invention includes: a first substrate including a first connector and a second connector in which the width directions thereof are parallel to a first direction; a second substrate including a third connector and a fourth connector in which the width directions thereof are parallel to the first direction; a third substrate including a fifth connector and a sixth connector in which the width directions thereof are parallel to the first direction; a first flat cable connecting the first connector and the third connector; a second flat cable connecting the second connector and the fifth connector; and a third flat cable connecting the fourth connector and the sixth connector.

8 Claims, 14 Drawing Sheets

(58) Field of Classification Search
USPC ........................................................ 174/254
See application file for complete search history.

(56) References Cited

FOREIGN PATENT DOCUMENTS

| | | |
|---|---|---|
| JP | S60-118813 U | 8/1985 |
| JP | S61-204573 A | 9/1986 |
| JP | 2004-135012 A | 4/2004 |
| TW | 201016088 A | 4/2010 |

OTHER PUBLICATIONS

International Search Report for PCT Application No. PCT/JP2022/000310, mailed on Apr. 5, 2022.

English translation of Written opinion for PCT Application No. PCT/JP2022/000310, mailed on Apr. 5, 2022.

JP Office Action for JP Application No. 2021-021397, mailed on Oct. 11, 2022 with English Translation.

* cited by examiner

Fig.13

CONNECTOR

CONNECTOR

FLAT CABLE

COMPOSITE SUBSTRATE AND ELECTRICAL DEVICE

This application is a National Stage Entry of PCT/JP2022/000310 filed on Jan. 7, 2022, which claims priority from JP Patent Application 2021-021397 filed on Feb. 15, 2021, the contents of all of which are incorporated herein by reference, in their entirety.

TECHNICAL FIELD

The present disclosure relates to a composite substrate in which circuit substrates (hereinafter, also simply referred to as "substrates") are interconnected using flexible cables.

BACKGROUND ART

With progress in increasing a speed of operation in an electrical device, there is a need for a higher transmission speed in connection between substrates constituting the electrical device. Thus, necessity of shortening line lengths of cables increases. In order to shorten the line lengths of the cables connecting the substrates, the connection between the substrates may be made compact by using flexible cables (hereinafter, also referred to as "flat cables").

An example of a technology for connecting two substrates by flat cables is disclosed in PTL 1. A mobile communication terminal device of PTL 1 includes an upper printed substrate, a lower printed substrate, and a flexible substrate. The flexible substrate connects a connector provided on the upper printed substrate and a connector provided on the lower printed substrate. The flexible substrate includes two flexible substrate pieces bonded to each other in a state of being superposed on each other. Each of the flexible substrate pieces has two belt-shaped portions and an intermediate portion connecting the two belt-shaped portions in a crank shape. As a result of the above configuration, in the mobile communication terminal device of PTL 1, the flexible substrate connects the upper printed substrate and the lower printed substrate.

In a case where a composite substrate is developed by interconnecting a large number of substrates, not only flat cables but also large-diameter cables are often used in order to facilitate design of the composite substrate.

An example of a technology for connecting four substrates using large-diameter cables will be described.

FIG. 11 is a perspective view illustrating an example of a configuration of an electrical device referred to in the present disclosure. In FIG. 11, illustration of upper and lower portions of the electrical device is omitted. FIG. 12 is a top perspective view illustrating an example of the configuration of the electrical device referred to in the present disclosure. As illustrated in FIGS. 11 and 12, an electrical device 809 referred to in the present disclosure includes a composite substrate 309, two substrate holding units 591 and 592, two shelves 691 and 692, and two 19-inch racks 791 and 792.

The composite substrate 309 includes four substrates 191, 192, 193, and 194 and cables.

The substrates 191, 192, 193, and 194 have the same outer shape and the same connector arrangement. The substrates 191 and 192 are held by the substrate holding unit 591, and the substrates 193 and 194 are held by the substrate holding unit 592.

The rack 791 (19-inch rack) and the rack 792 (19-inch rack) are installed adjacent to each other in a left-right direction. The rack 791 has at least one shelf 691, and the rack 792 has at least one shelf 692.

The shelf 691 supports the substrate holding unit 591, and the shelf 692 supports the substrate holding unit 592.

The substrate holding unit 591 holds the substrate 191 on a front side and holds the substrate 192 on a back side.

The substrate holding unit 592 holds the substrate 194 on the front side and holds the substrate 193 on the back side.

FIG. 14 is a front view illustrating an example of a configuration of the substrate included in the electrical device referred to in the present disclosure. Although the substrate 191 is exemplified in FIG. 14, the substrates 192, 193, and 194 also have the same outer shape and the same connector arrangement. As illustrated in FIG. 14, each of the substrates 191, 192, 193, and 194 has connector groups 291 and 292 on one side of the left-right direction on one surface. Each connector group connects the substrates. Each of the substrates 191, 192, 193, and 194 is arranged in such a direction that the connector groups 291 and 292 are on a center side in the left-right direction. In FIGS. 11 and 14, the direction of each substrate is indicated by a character "A" displayed on upper left of each substrate when viewed from the front side (note that, in the substrates 192 and 193, the character seen through from the back side is displayed). The connector groups 291 and 292 of the substrates are connected by flat cables between the substrate 191 and the substrate 192 and between the substrate 193 and the substrate 194 (between the substrates in the same rack). On the other hand, the connector groups 291 and 292 of the substrates are connected by large-diameter cables between the substrate 191 and the substrate 193 or 194 and between the substrate 192 and the substrate 193 or 194 (between the substrates across the rack).

Figure 13:
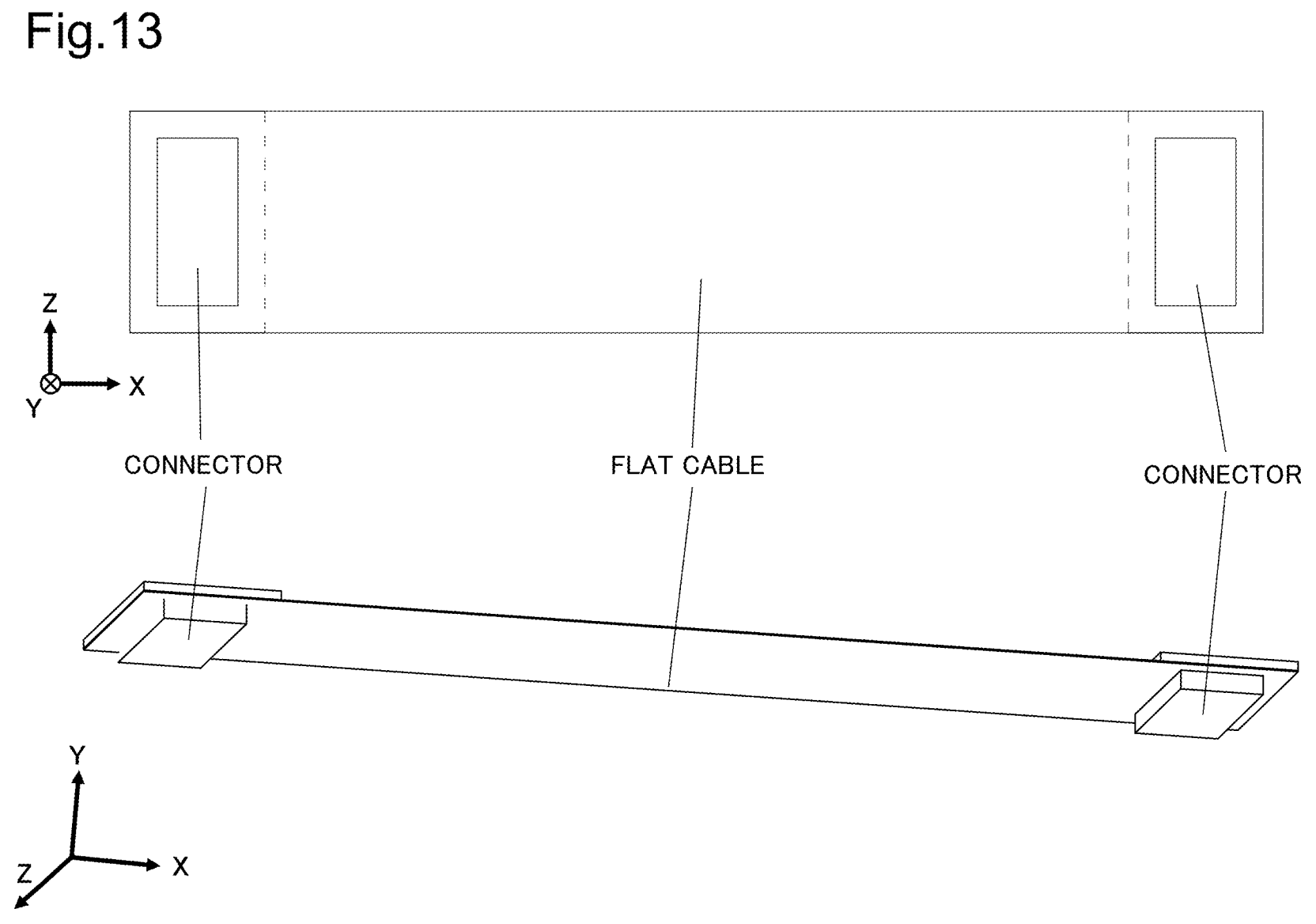

FIG. 13 is a perspective view illustrating an example of a configuration of the flat cable included in the electrical device referred to in the present disclosure. As illustrated in FIG. 13, the flat cable has a strip shape, and has connectors at both ends on the same surface.

As illustrated in FIG. 14, on the substrate 191, the connector group 291 is installed on an upper side, and the connector group 292 is installed on a lower side. The connector group 291 includes connectors A11 and A12 from upper right to bottom, connectors B11 and B12 from upper center to the bottom, and connectors C11 and C12 from upper left to the bottom. The connector group 292 includes connectors A21 and A22 from upper right to bottom, connectors B21 and B22 from upper center to the bottom, and connectors C21 and C22 from upper left to the bottom.

The flat cables connect the connectors A11 and A22 and the connectors A12 and A21 between the substrate 191 and the substrate 192 and between the substrate 193 and the substrate 194.

The large-diameter cables connect the connectors B11 and B22 and the connectors B12 and B21 between the substrate 191 and the substrate 194 and between the substrate 192 and the substrate 193. The large-diameter cables also connect the connectors C11 and C11, the connectors C12 and C12, the connectors C21 and C21, and the connectors C22 and C22 between the substrate 191 and the substrate 193 and between the substrate 192 and the substrate 194.

CITATION LIST

Patent Literature

PTL 1: JP 2004-135012 A

SUMMARY OF INVENTION

Technical Problem

In the electrical device 809 referred to in the present disclosure, the large-diameter cables connect the substrates between the racks. Here, in order to secure a space for installing the large-diameter cables (so-called "cable processing area" surrounded by a dotted line illustrated in FIG. 12), it is necessary to secure a certain amount of gap between the substrates. That is, as a result of using the large-diameter cables for the connection between the substrates, the electrical device 809 has problems that space saving is difficult, line lengths of the cables are difficult to shorten, and maintainability of the cables is poor.

The present disclosure has been made in view of the above problems, and a main object of the present invention is to interconnect equal to or more than three substrates compactly by flat cables.

In one aspect of the present disclosure, a composite substrate includes a first substrate that includes a first connector and a second connector having width directions parallel to a first direction, a second substrate that includes a third connector and a fourth connector having width directions parallel to the first direction, a third substrate that includes a fifth connector and a sixth connector having width directions parallel to the first direction, a first flat cable that connects the first connector and the third connector, a second flat cable that connects the second connector and the fifth connector, and a third flat cable that connects the fourth connector and the sixth connector.

In one aspect of the present disclosure, an electrical device includes a composite substrate, and the composite substrate includes a first substrate that includes a first connector and a second connector having width directions parallel to a first direction, a second substrate that includes a third connector and a fourth connector having width directions parallel to the first direction, a third substrate that includes a fifth connector and a sixth connector having width directions parallel to the first direction, a first flat cable that connects the first connector and the third connector, a second flat cable that connects the second connector and the fifth connector, and a third flat cable that connects the fourth connector and the sixth connector.

Advantageous Effects of Invention

According to the present disclosure, there is an effect that equal to or more than three substrates can be interconnected compactly by flat cables.

BRIEF DESCRIPTION OF DRAWINGS

FIG. 13 is a perspective view illustrating an example of a configuration of a composite flat cable included in the electrical device referred to in the present invention.

EXAMPLE EMBODIMENT

Hereinafter, example embodiments of the present invention will be described in detail with reference to the drawings. In all the drawings, equivalent components are denoted by the same reference signs, and description of the components will be omitted as appropriate.

First Example Embodiment

A first example embodiment of the present invention, which is a basis of each example embodiment of the present invention, will be described.

A configuration in the present example embodiment will be described.

Figure 1:
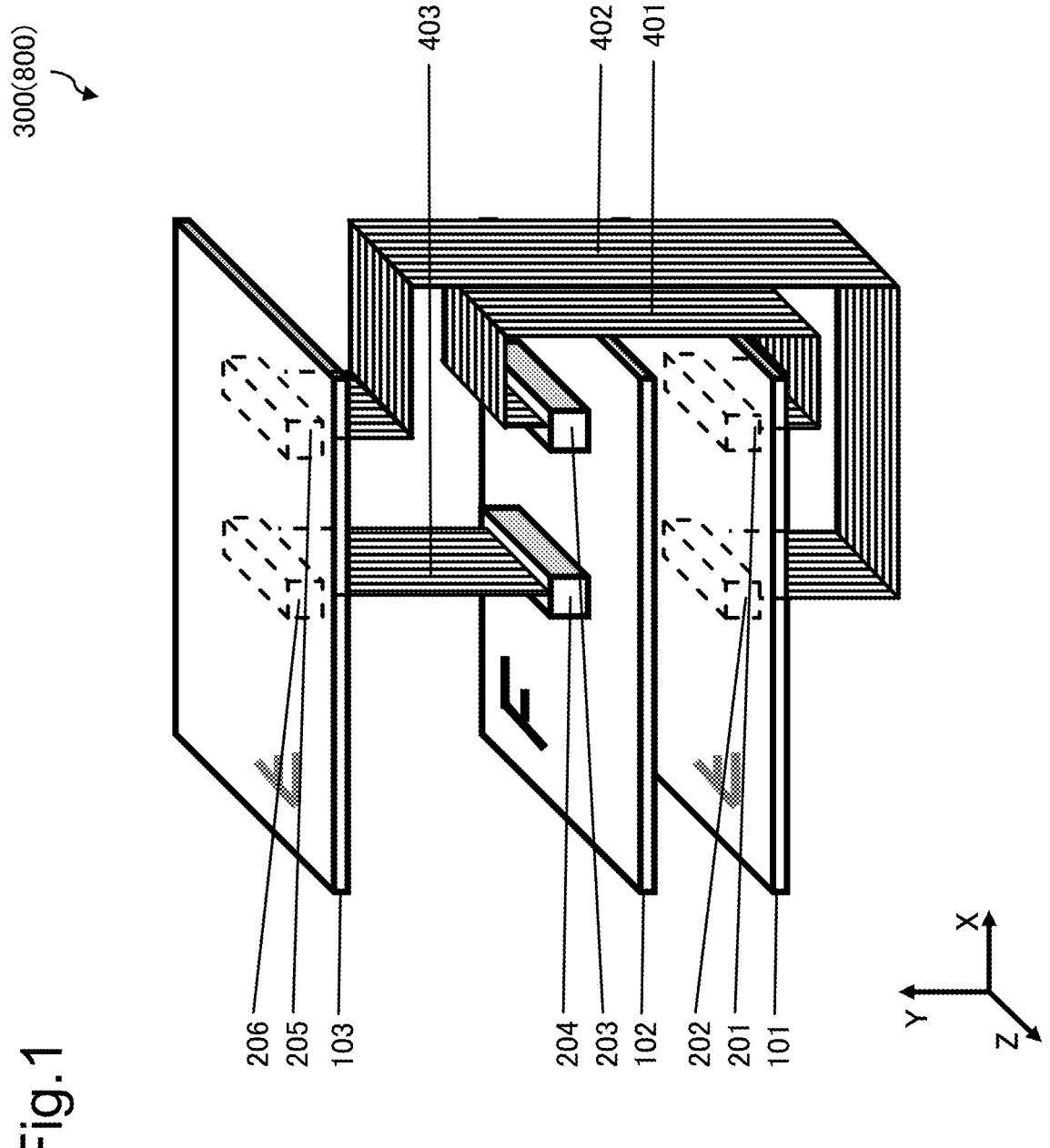
FIG. 1 is a perspective view illustrating an example of a configuration of an electrical device in a first example embodiment of the present invention.

FIG. 1 is a perspective view illustrating an example of a configuration of an electrical device in the first example embodiment of the present invention. In the drawings after FIG. 1 and the following description, a direction in which the electrical device is installed is an example, and the direction in which the electrical device is actually installed may be any direction. In the drawings after FIG. 1 and the following description, a width (left-right) direction of the electrical device is indicated by "X", a depth (front-back) direction of the electrical device is indicated by "Y", and a height (up-down) direction of the electrical device is indicated by "Z", when viewed from a certain direction. That is, the X direction, the Y direction, and the Z direction are directions orthogonal to each other. In the X direction, the Y direction, and the Z direction, a right direction, a depth direction, and an upper direction are referred to as "positive directions", and a left direction, a front direction, and a lower direction are referred to as "negative directions". In the following description, a positive direction side in the X direction is also referred to as an "X+" side, a negative direction side in the X direction is also referred to as an "X−"

side, a positive direction side in the Y direction is also referred to as a "Y+" side, a negative direction side in the Y direction is also referred to as a "Y−" side, a positive direction side in the Z direction is also referred to as a "Z+" side, and a negative direction side in the Z direction is also referred to as a "Z−" side. FIG. 1 illustrates an example in which substrates have the same outer shape and the same connector arrangement. FIG. 1 also illustrates an example in which all of a plurality of connectors are arranged on the same main surface in each substrate. A direction of each substrate is indicated by a character "F" displayed on upper left of each substrate when viewed from a front side (note that, in substrates 101 and 103, the character seen through from a back side is displayed). Components seen through back surfaces of the substrates are indicated by dotted lines.

As illustrated in FIG. 1, an electrical device 800 in the present example embodiment includes a composite substrate 300.

The composite substrate 300 includes the first substrate 101, a second substrate 102, the third substrate 103, a first flat cable 401, a second flat cable 402, and a third flat cable 403.

The first substrate 101 includes a first connector 201 and a second connector 202 having width directions parallel to a first direction (Z direction in the example of FIG. 1). In the example of FIG. 1, the first connector 201 and the second connector 202 are arranged at the center of the first substrate 101 in the width direction (Z direction).

The second substrate 102 includes a third connector 203 and a fourth connector 204 having width directions parallel to the first direction. In the example of FIG. 1, the third connector 203 and the fourth connector 204 are arranged at the center of the second substrate 102 in the width direction (Z direction).

The third substrate 103 includes a fifth connector 205 and a sixth connector 206 having width directions parallel to the first direction. In the example of FIG. 1, the fifth connector 205 and the sixth connector 206 are arranged at the center of the third substrate 103 in the width direction (Z direction).

Operation in the present example embodiment will be described.

The first flat cable 401 connects the first connector 201 and the third connector 203.

The second flat cable 402 connects the second connector 202 and the fifth connector 205.

The third flat cable 403 connects the fourth connector 204 and the sixth connector 206.

As described above, the electrical device 800 of the present example embodiment includes the composite substrate 300. The composite substrate 300 includes the first substrate 101, the second substrate 102, the third substrate 103, the first flat cable 401, the second flat cable 402, and the third flat cable 403. The first flat cable 401 connects the first connector 201 and the third connector 203. The second flat cable 402 connects the second connector 202 and the fifth connector 205. The third flat cable 403 connects the fourth connector 204 and the sixth connector 206. The first connector 201 to the sixth connector 206 have the width directions parallel to the first direction. Thus, all or a part of the first flat cable 401, the second flat cable 402, and the third flat cable 403 can be compactly arranged in a state of being superposed on each other. Here, the arrangement in the state of being superposed on each other is a state where, for example, when the composite substrate 300 is viewed from the Y direction, all or a part of the first flat cable 401, the second flat cable 402, and the third flat cable 403 appear to overlap each other in plan view. Therefore, the electrical device 800 (composite substrate 300) of the present example embodiment has an effect that equal to or more than three substrates can be compactly interconnected by flat cables.

In the electrical device 800 in the present example embodiment, the substrates are compactly interconnected by the flat cables, and as a result, line lengths of the cables can be shortened. In the electrical device 800 in the present example embodiment, the substrates are compactly interconnected by the flat cables, and as a result, maintainability of the cables is improved.

In the present example embodiment, the flat cable may be a straight cable or a cross cable. In the present example embodiment, a width of the flat cable in the first direction may be less than the width of the substrate, may be less than ½ of the width of the substrate, or may be narrower. In the present example embodiment, the flat cable may have a shape in which one end and the other end are shifted in the width direction. In the present example embodiment, order of signal lines in the width direction of the flat cable may be the same at one end and the other end, or may be reversed at one end and the other end. In the present example embodiment, the connector may be a connector used with a limited direction in the width direction, or may be a connector that can be used with the direction in the width direction reversed. Here, detailed description of various flat cables and connectors is omitted.

In FIG. 1, a case has been exemplified where the substrates are arranged in parallel with each other (parallel to an X-Z plane) to be superposed above each other when viewed from the Y direction. However, the arrangement of the substrates in the present example embodiment is not limited to the example of FIG. 1, and it is sufficient that the connectors are arranged in parallel (parallel to the Z-axis direction in FIG. 1).

In the electrical device 800 of the present example embodiment, the second substrate 102 and the third substrate 103 may be arranged in parallel with the first substrate 101. In this case, the electrical device 800 of the present example embodiment has an effect that the first substrate 101, the second substrate 102, and the third substrate 103 can be more compactly arranged closer to each other.

In the electrical device 800 of the present example embodiment, the second substrate 102 and the third substrate 103 may be arranged to be superposed above the first substrate 101 when viewed from a certain direction (in FIG. 1, arranged to be superposed above each other when viewed from the Y direction). In this case, the electrical device 800 of the present example embodiment has an effect that it is possible to suppress a cross-sectional area necessary for installation of the first substrate 101, the second substrate 102, and the third substrate 103 (cross-sectional area perpendicular to the Y-axis in the example of FIG. 1).

Second Example Embodiment

A second example embodiment of the present invention based on the first example embodiment of the present invention will be described. In the present example embodiment, an electrical device includes four substrates.

A configuration in the present example embodiment will be described.

Figure 2:
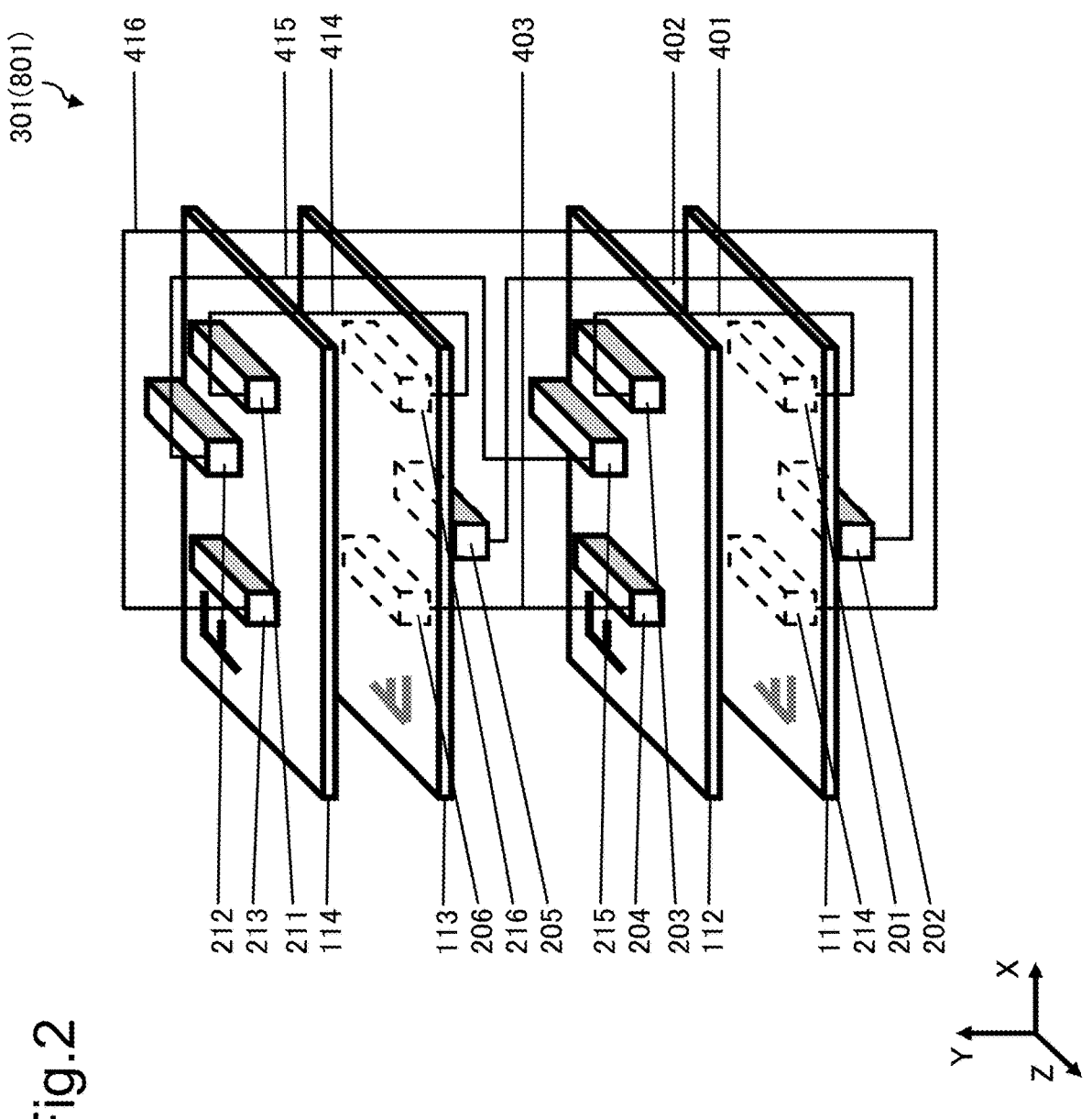
FIG. 2 is a perspective view illustrating an example of a configuration of an electrical device in a second example embodiment of the present invention.

FIG. 2 is a perspective view illustrating an example of a configuration of the electrical device in the second example embodiment of the present invention. FIG. 2 illustrates an example in which the substrates have the same outer shape and the same connector arrangement. FIG. 2 also illustrates an example in which all of a plurality of connectors are arranged on the same main surface in each substrate. A direction of each substrate is indicated by a character "F" displayed on upper left of each substrate when viewed from the front side (note that, in substrates 111 and 113, the character seen through from the back side is displayed). Components seen through back surfaces of the substrates are indicated by dotted lines. In FIG. 2, a flat cable is represented by a line, but actually has a strip shape. Here, the line represents a side on the Z+ side of the strip shape, and a side on the Z− side is omitted.

As illustrated in FIG. 2, an electrical device 801 in the present example embodiment includes a composite substrate 301.

The composite substrate 301 includes the first substrate 111, a second substrate 112, the third substrate 113, a fourth substrate 114, a first flat cable 401, a second flat cable 402, a third flat cable 403, a fourth flat cable 414, a fifth flat cable 415, and a sixth flat cable 416.

The first substrate 111 includes a first connector 201, a second connector 202, and a tenth connector 214 having width directions parallel to the first direction (Z direction in the example of FIG. 2). In the example of FIG. 2, the first connector 201 and the tenth connector 214 are arranged at the center of the first substrate 111 in the width direction (Z direction), and the second connector 202 is arranged on the Z+ side of the first substrate 111 in the width direction.

The second substrate 112 includes a third connector 203, a fourth connector 204, and an eleventh connector 215 having width directions parallel to the first direction. In the example of FIG. 2, the third connector 203 and the fourth connector 204 are arranged at the center of the second substrate 112 in the width direction (Z direction), and the eleventh connector 215 is arranged on the Z-side of the second substrate 112 in the width direction.

The third substrate 113 includes a fifth connector 205, a sixth connector 206, and a twelfth connector 216 having width directions parallel to the first direction. In the example of FIG. 2, the sixth connector 206 and the twelfth connector 216 are arranged at the center of the third substrate 113 in the width direction (Z direction), and the fifth connector 205 is arranged on the Z+ side of the third substrate 113 in the width direction.

The fourth substrate 114 includes a seventh connector 211, an eighth connector 212, and a ninth connector 213 having width directions parallel to the first direction. In the example of FIG. 2, the seventh connector 211 and the ninth connector 213 are arranged at the center of the fourth substrate 114 in the width direction (Z direction), and the eighth connector 212 is arranged on the Z-side of the fourth substrate 114 in the width direction.

Operation in the present example embodiment will be described.

The first flat cable 401 connects the first connector 201 and the third connector 203.

The second flat cable 402 connects the second connector 202 and the fifth connector 205.

The third flat cable 403 connects the fourth connector 204 and the sixth connector 206.

The fourth flat cable 414 connects the seventh connector 211 and the twelfth connector 216.

The fifth flat cable 415 connects the eighth connector 212 and the eleventh connector 215.

The sixth flat cable 416 connects the ninth connector 213 and the tenth connector 214.

As described above, the electrical device 801 of the present example embodiment includes the composite substrate 301. The composite substrate 301 includes the first substrate 111, the second substrate 112, the third substrate 113, the fourth substrate 114, the first flat cable 401, the second flat cable 402, the third flat cable 403, the fourth flat cable 414, the fifth flat cable 415, and the sixth flat cable 416. The first flat cable 401 connects the first connector 201 and the third connector 203. The second flat cable 402 connects the second connector 202 and the fifth connector 205. The third flat cable 403 connects the fourth connector 204 and the sixth connector 206. The fourth flat cable 414 connects the seventh connector 211 and the twelfth connector 216. The fifth flat cable 415 connects the eighth connector 212 and the eleventh connector 215. The sixth flat cable 416 connects the ninth connector 213 and the tenth connector 214. The first connector 201 to the twelfth connector 216 have the width directions parallel to the first direction. Thus, all or a part of the first flat cable 401 to the sixth flat cable 416 can be compactly arranged in a state of being superposed on each other. Here, the arrangement in the state of being superposed on each other is a state where, for example, when the composite substrate 301 is viewed from the Y direction, all or a part of the first flat cable 401 to the sixth flat cable 416 appear to overlap each other in plan view. Therefore, the electrical device 801 (composite substrate 301) of the present example embodiment has an effect that equal to or more than three (four) substrates can be compactly interconnected by flat cables.

In FIG. 2, a case has been exemplified where the substrates are arranged in parallel with each other (parallel to the X-Z plane) to be superposed above each other when viewed from the Y direction. However, the arrangement of the substrates in the present example embodiment is not limited to the example of FIG. 2, and it is sufficient that the connectors are arranged in parallel (parallel to the Z-axis direction in FIG. 2).

In the electrical device 801 of the present example embodiment, the second substrate 112, the third substrate 113, and the fourth substrate 114 may be arranged in parallel with the first substrate 111. In this case, the electrical device 801 of the present example embodiment has an effect that the first substrate 111, the second substrate 112, the third substrate 113, and the fourth substrate 114 can be more compactly arranged closer to each other.

In the electrical device 801 of the present example embodiment, the second substrate 112, the third substrate 113, and the fourth substrate 114 may be arranged to be superposed above the first substrate 111 when viewed from a certain direction (in FIG. 2, arranged to be superposed above each other when viewed from the Y direction). In this case, the electrical device 801 of the present example embodiment has an effect that it is possible to suppress a cross-sectional area necessary for installation of the first substrate 111, the second substrate 112, the third substrate 113, and the fourth substrate 114 (cross-sectional area perpendicular to the Y-axis in the example of FIG. 2).

Third Example Embodiment

A third example embodiment of the present invention based on the second example embodiment of the present invention will be described. In the present example embodiment, an electrical device includes four substrates having the same outer shape and the same connector arrangement.

A configuration in the present example embodiment will be described.

Figure 3:
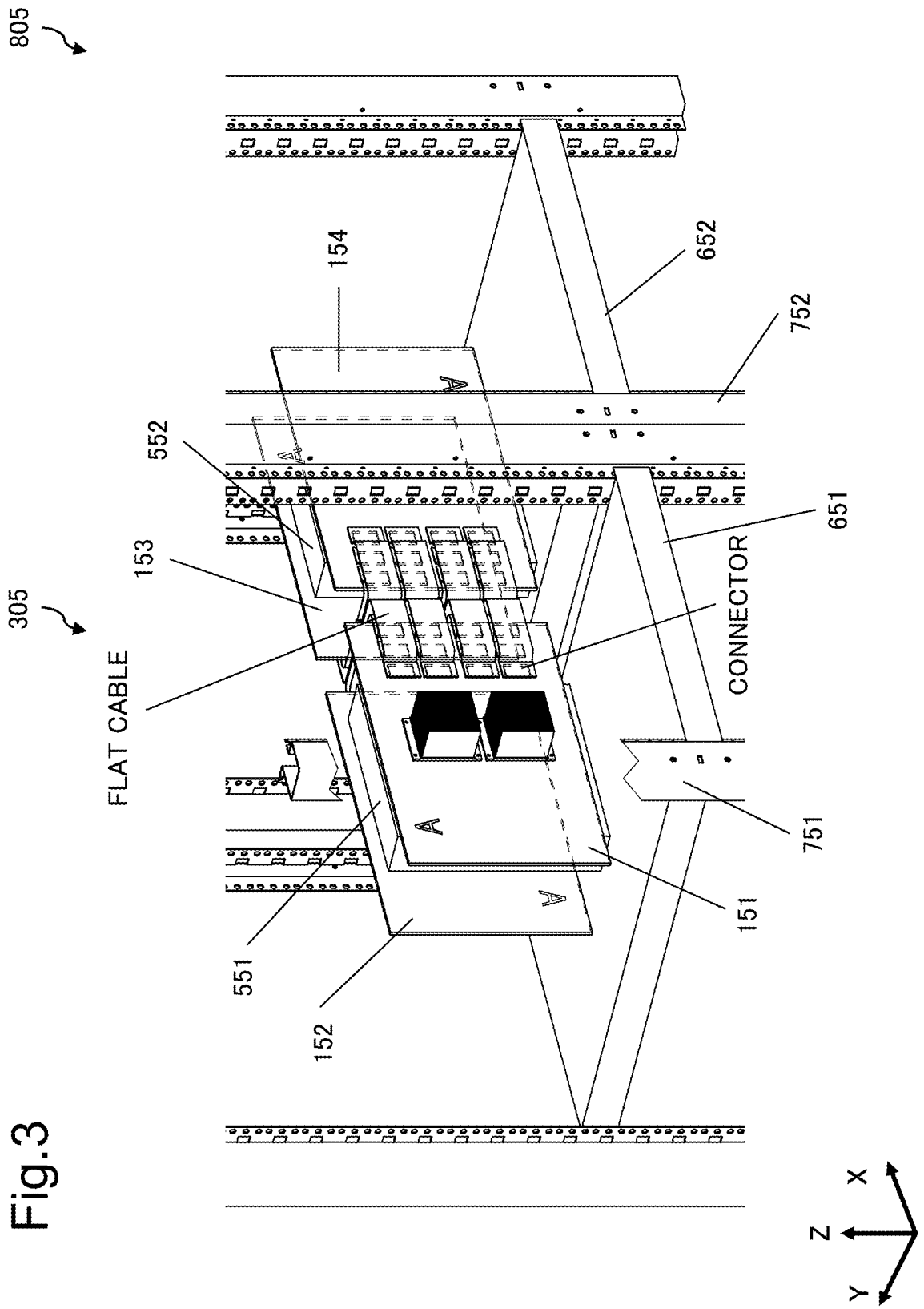
FIG. 3 is a perspective view illustrating an example of a configuration of an electrical device in a third example embodiment of the present invention.

FIG. 3 is a perspective view illustrating an example of a configuration of the electrical device in the third example embodiment of the present invention. In FIG. 3, illustration of upper and lower portions of the electrical device is omitted. As illustrated in FIG. 3, an electrical device 805 in the present example embodiment includes a composite substrate 305, two substrate holding units 551 and 552, two shelves 651 and 652, and two 19-inch racks 751 and 752.

The composite substrate 305 includes four substrates 151, 152, 153, and 154 and cables.

The substrates 151, 152, 153, and 154 have the same outer shape and the same connector arrangement. The substrates 151 and 152 are held by the substrate holding unit 551, and the substrates 153 and 154 are held by the substrate holding unit 552.

The rack 751 (19-inch rack) and the rack 752 (19-inch rack) are installed adjacent to each other in the left-right direction. The rack 751 has at least one shelf 651, and the rack 752 has at least one shelf 652.

The shelf 651 supports the substrate holding unit 551, and the shelf 652 supports the substrate holding unit 552.

The substrate holding unit 551 holds the substrate 151 on the front side and holds the substrate 152 on the back side.

The substrate holding unit 552 holds the substrate 154 on the front side and holds the substrate 153 on the back side.

Each of the substrates 151, 152, 153, and 154 has connector groups 251 and 252 on one side of the left-right direction on one surface. Each connector group connects the substrates. Each of the substrates 151, 152, 153, and 154 is arranged in such a direction that the connector groups 251 and 252 are on a center side in the left-right direction. In FIG. 3, the direction of each substrate is indicated by a character "A" displayed on upper left of each substrate when viewed from the front side (note that, in the substrates 152 and 153, the character seen through from the back side is displayed). The connector groups 251 and 252 of the substrates are connected by flat cables.

Figure 4:
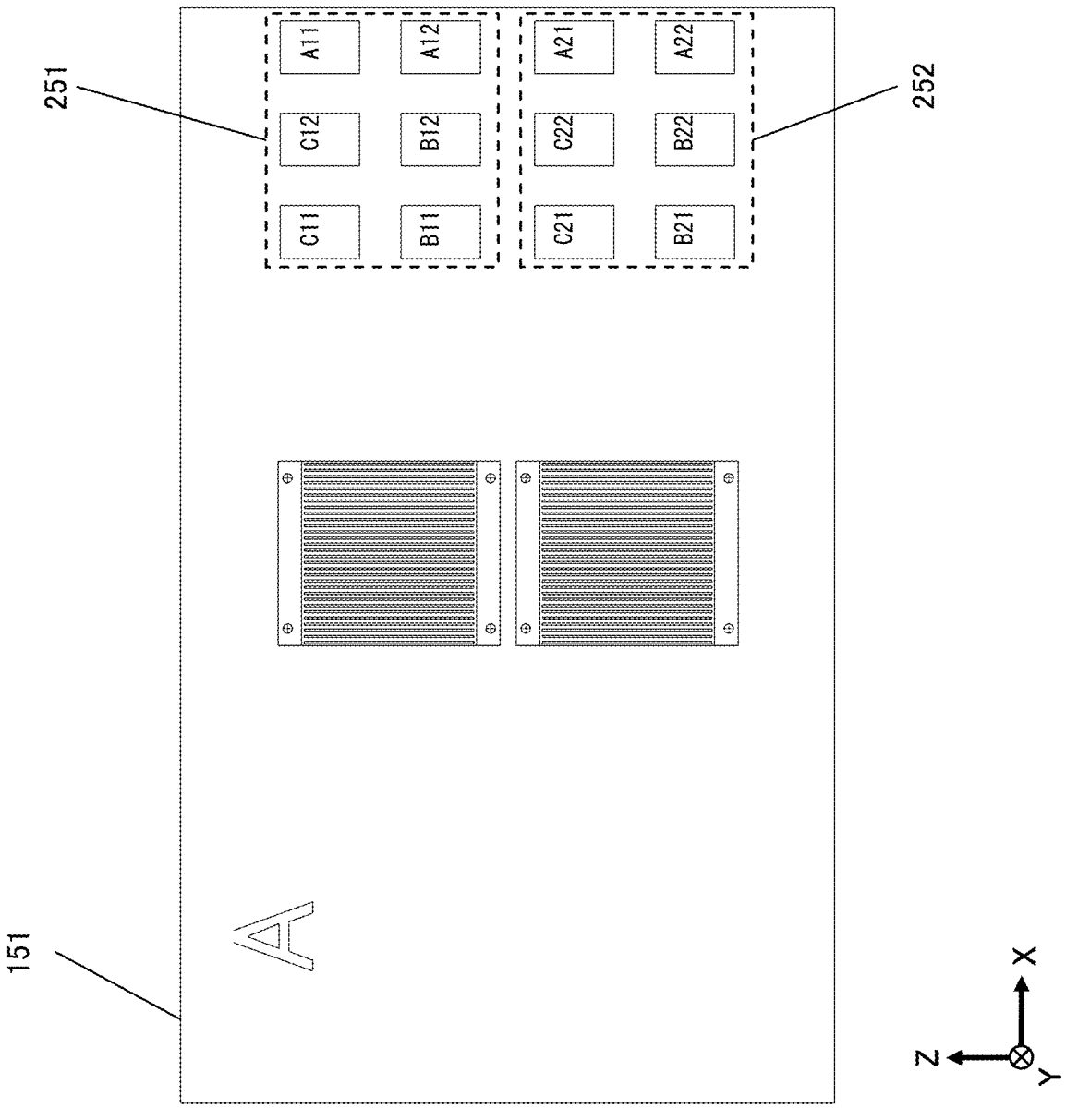
FIG. 4 is a front view illustrating an example of a configuration of a substrate included in the electrical device in the third example embodiment of the present invention.

FIG. 4 is a front view illustrating an example of a configuration of the substrate included in the electrical device in the third example embodiment of the present invention. Although the substrate 151 is exemplified in FIG. 4, the substrates 152, 153, and 154 also have the same outer shape and the same connector arrangement. As illustrated in FIG. 4, on the substrate 151, the connector group 251 is installed on an upper side, and the connector group 252 is installed on a lower side. The connector group 251 includes connectors A11 and A12 from upper right to bottom, connectors C12 and B12 from upper center to the bottom, and connectors C11 and B11 from upper left to the bottom. The connector group 252 includes connectors A21 and A22 from upper right to bottom, connectors C22 and B22 from upper center to the bottom, and connectors C21 and B21 from upper left to the bottom.

Figure 5:
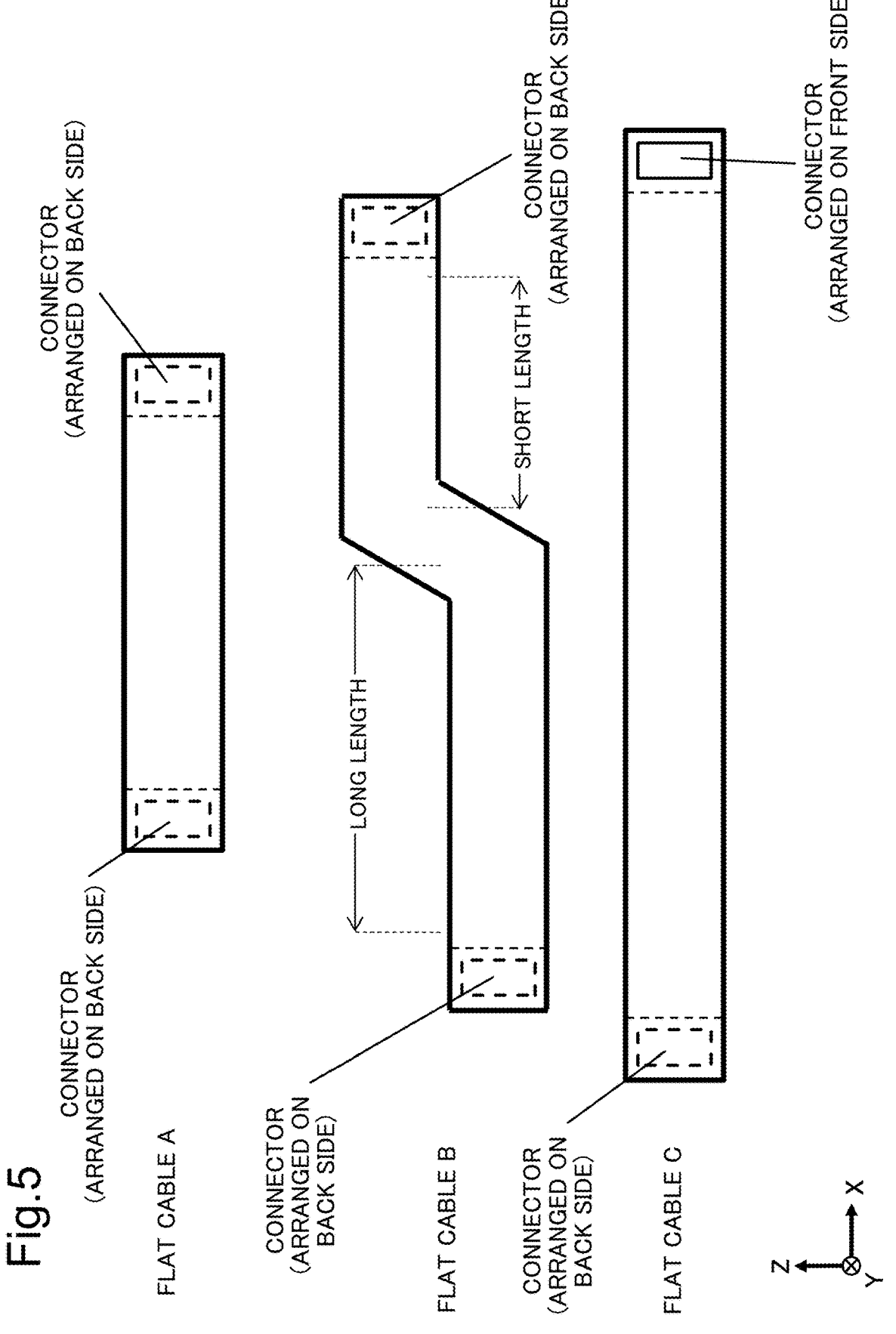
FIG. 5 is a front view illustrating an example of a configuration of a flat cable in the third example embodiment of the present invention.

FIG. 5 is a front view illustrating an example of a configuration of the flat cable in the third example embodiment of the present invention. As illustrated in FIG. 5, there are three types of the flat cables (flat cables A, B, and C) in the present example embodiment.

The flat cable A has a strip shape, and has connectors at both ends on the same surface.

The flat cable C has a strip shape, and has connectors at both ends on surfaces that are front and back of each other.

The flat cable B has a crank shape, and has connectors at both ends on the same surface. An offset amount of the connectors at both ends in the up-down direction (Z direction) is the same as a pitch between the connectors B12 and C12 and a pitch between the connectors B22 and C22 on the substrate 151. One end of the flat cable B is longer than the other end with a crank portion as a boundary. The flat cable B is adjusted to have a length with which all the connectors are not hidden by the cables when the two flat cables B are bonded to each other (see also FIG. 7 to be described later).

Operation in the present example embodiment will be described.

Figure 6:
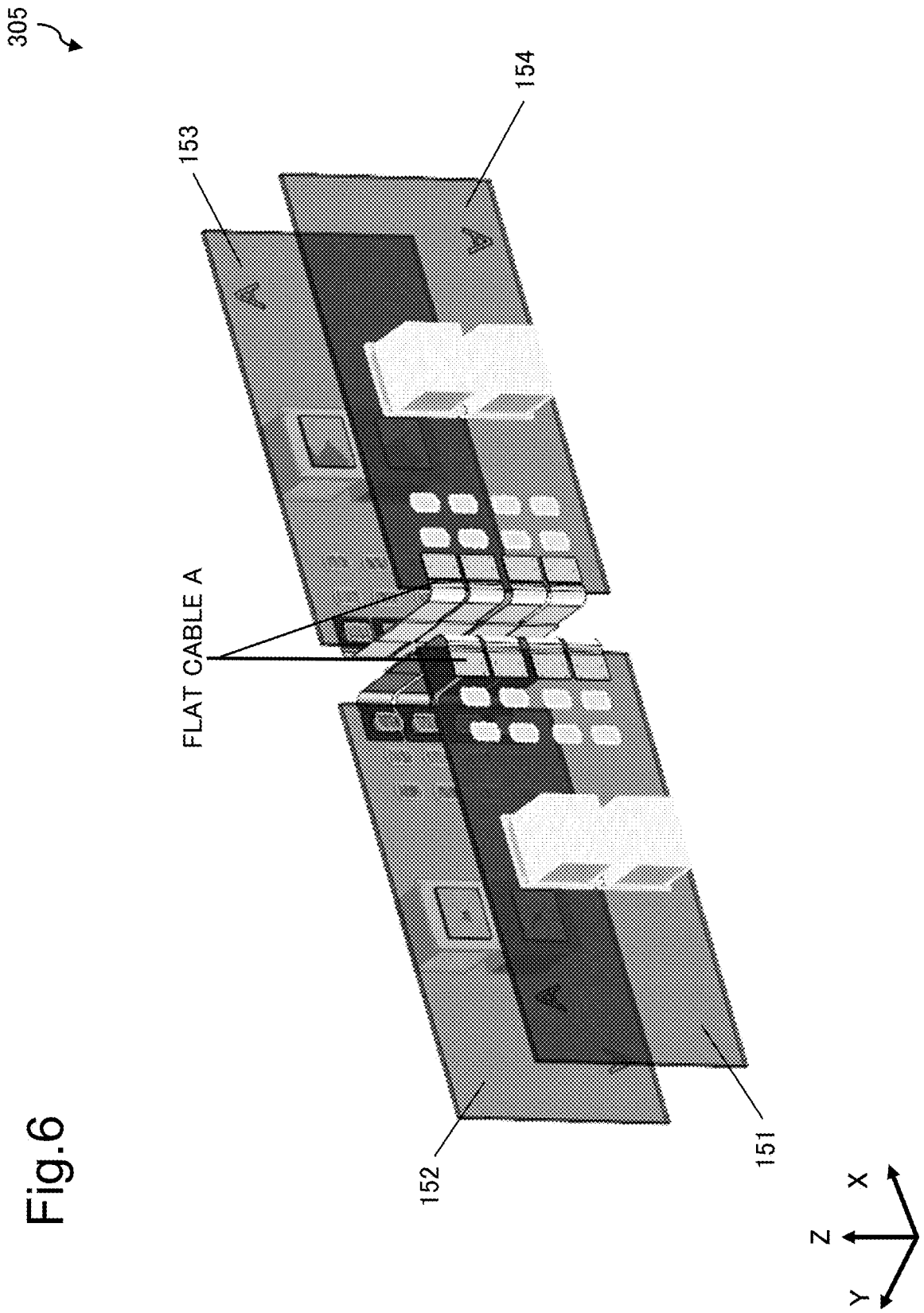
FIG. 6 is a perspective view illustrating an example of connection between substrates by a flat cable A in the third example embodiment of the present invention.

FIG. 6 is a perspective view illustrating an example of connection between the substrates by the flat cable A in the third example embodiment of the present invention. As illustrated in FIG. 6, the flat cable A connects the connectors A11 and A22 and the connectors A12 and A21 between the substrate 151 and the substrate 152 and between the substrate 153 and the substrate 154.

Figure 7:
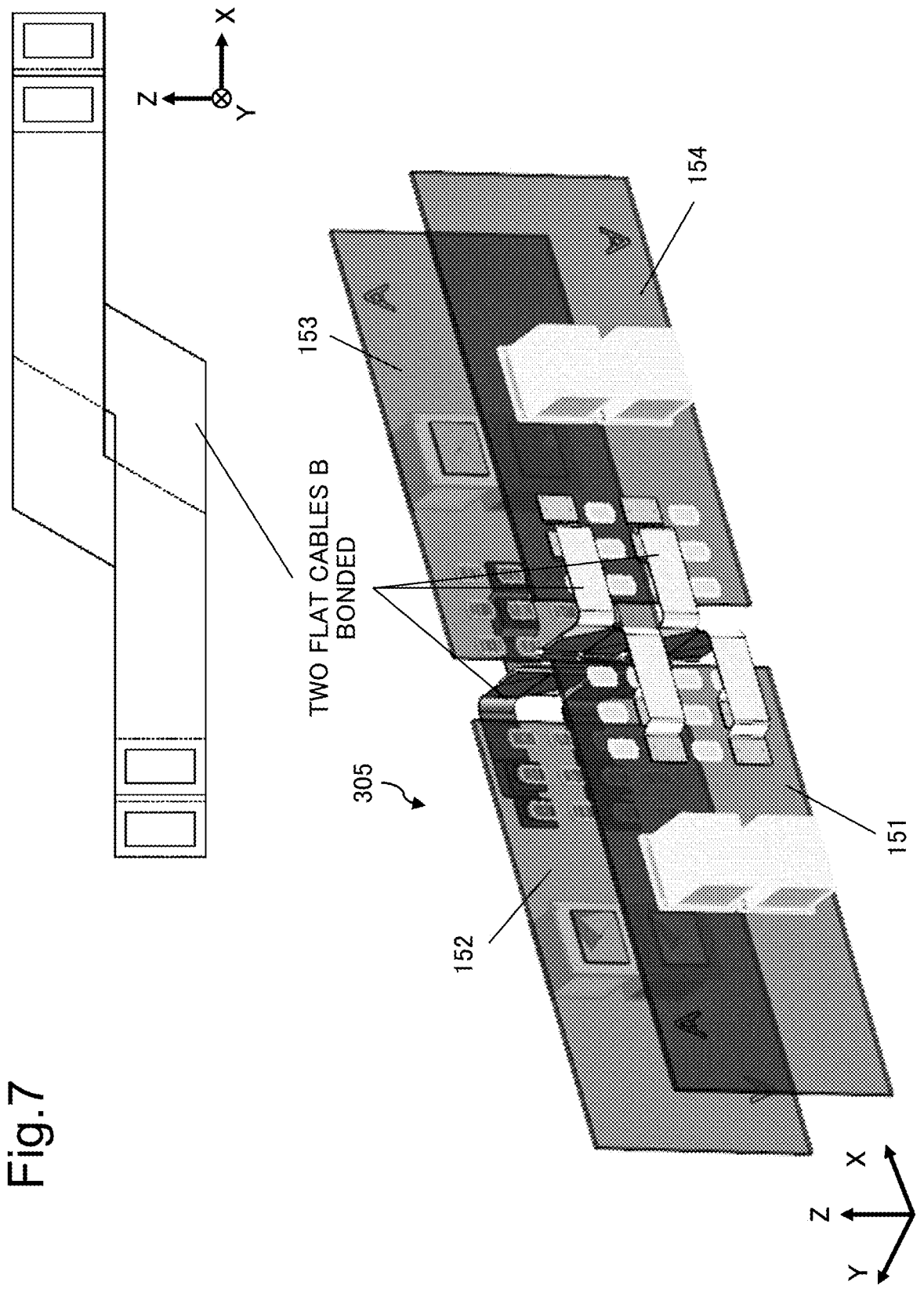
FIG. 7 is a perspective view illustrating an example of connection between the substrates by a flat cable B in the third example embodiment of the present invention.
Figure 8:
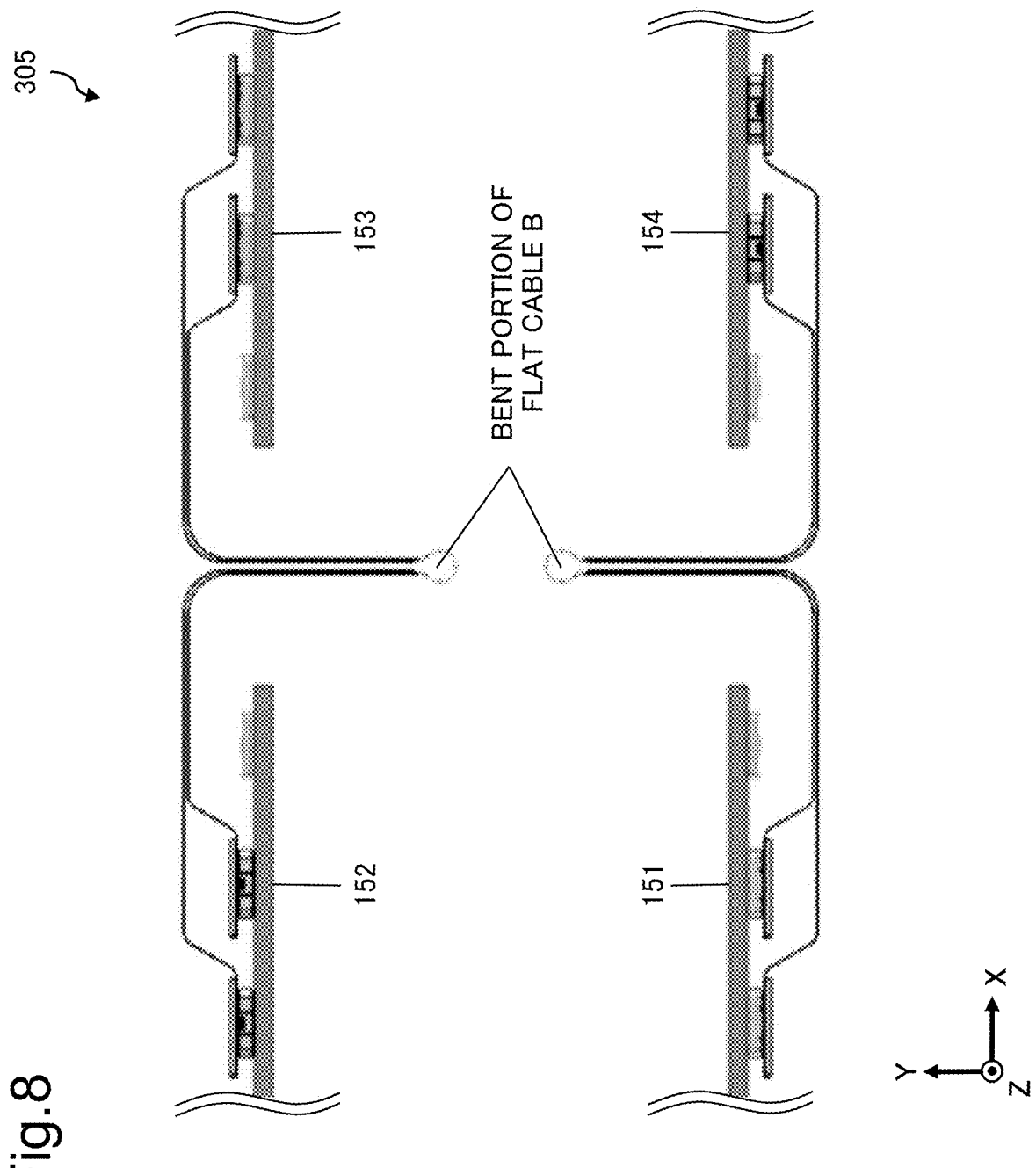
FIG. 8 is a top view illustrating an example of the connection between the substrates by the flat cable B in the third example embodiment of the present invention.

FIG. 7 is a perspective view illustrating an example of connection between the substrates by the flat cable B in the third example embodiment of the present invention. FIG. 8 is a top view illustrating an example of the connection between the substrates by the flat cable B in the third example embodiment of the present invention. As illustrated in FIGS. 7 and 8, the flat cable B connects the connectors B11 and B22 and the connectors B12 and B21 between the substrate 151 and the substrate 154 and between the substrate 152 and the substrate 153. As illustrated in an upper side of FIG. 7, the two flat cables B may be bonded in a state of being superposed on each other (two bonded), and may connect the substrates in a state of being bent in the vicinity of the center of the crank portion.

Figure 9:
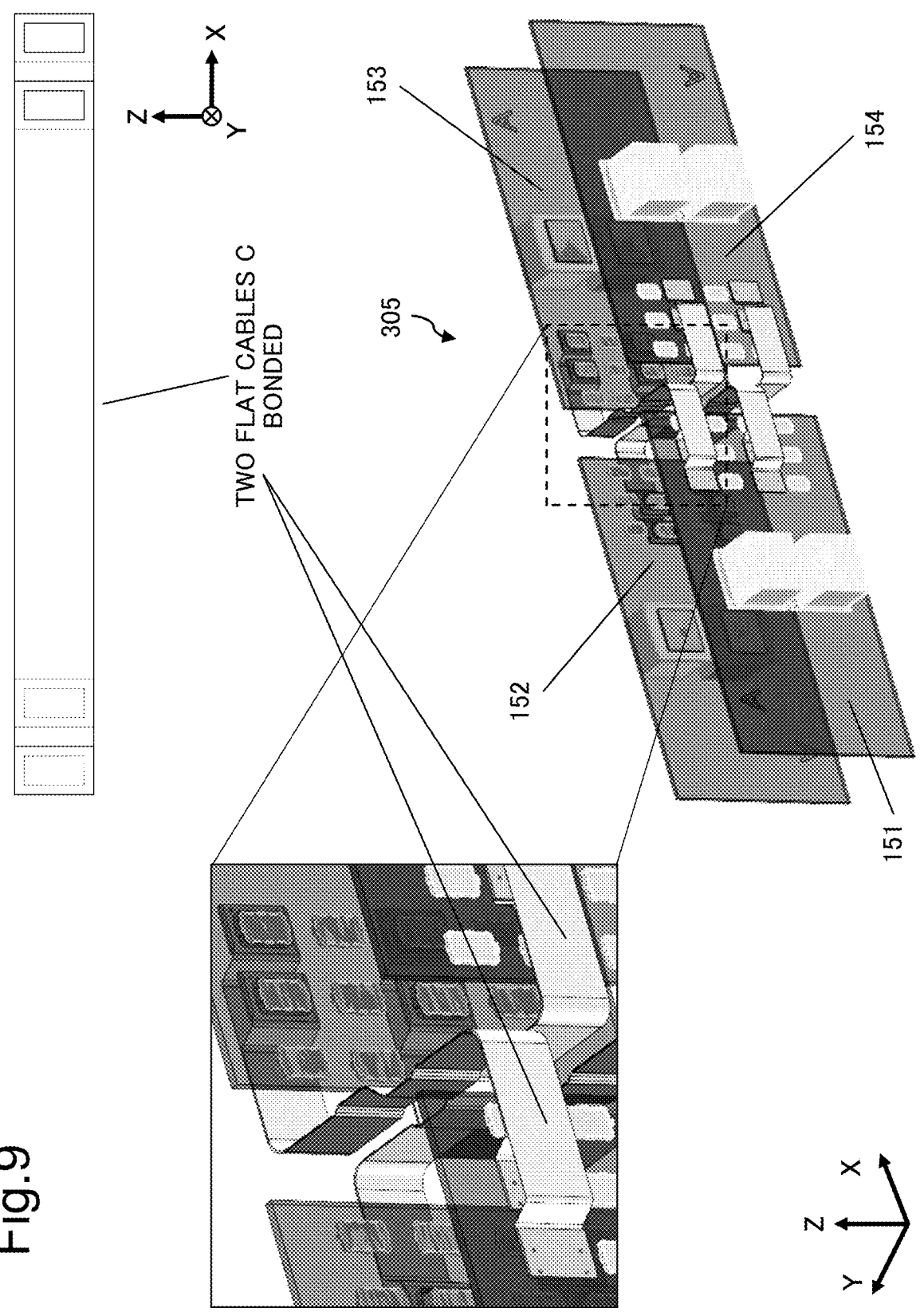
FIG. 9 is a perspective view illustrating an example of connection between the substrates by a flat cable C in the third example embodiment of the present invention.

FIG. 9 is a perspective view illustrating an example of connection between the substrates by the flat cable C in the third example embodiment of the present invention. The flat cable C connects the connectors C11 and C12 and the connectors C21 and C22 between the substrate 151 and the substrate 153 and between the substrate 152 and the substrate 154. As illustrated in an upper side of FIG. 9, the two flat cables C may connect the substrates in a state of being superposed on each other and bonded (two bonded).

The connection between the connectors A (the connectors A11, A12, A21, and A22 collectively) is connection between the different connector groups. The connection between the connectors B (the connectors B11, B12, B21, and B22 collectively) is connection between the different connector groups. The connection between the connectors C (the connectors C11, C12, C21, and C22 collectively) is connection between the same connector groups.

Figure 10:
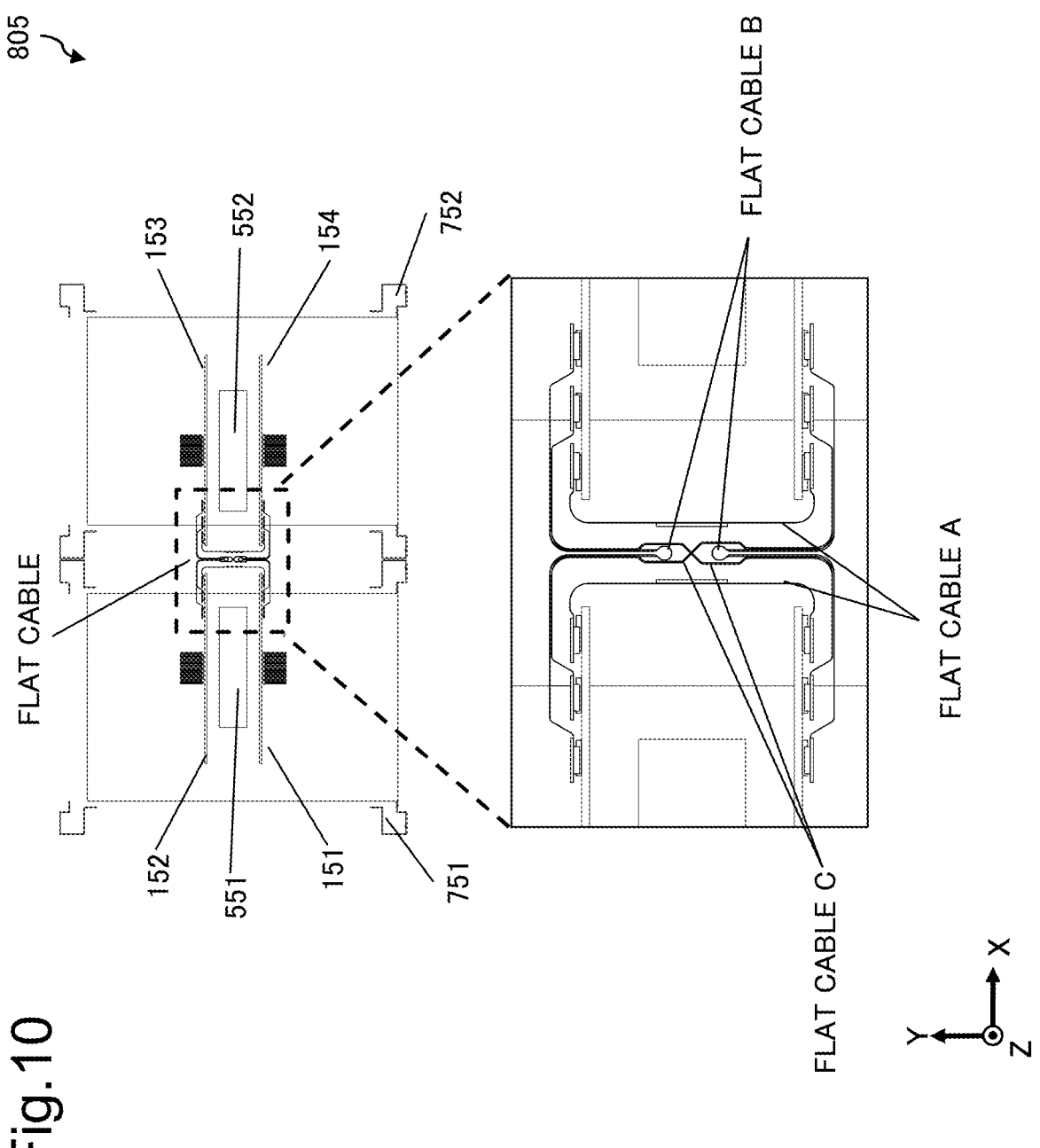
FIG. 10 is a top perspective view illustrating an example of the connection between the substrates by the flat cables in the third example embodiment of the present invention.
Figure 11:
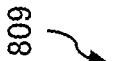
FIG. 11 is a perspective view illustrating an example of a configuration of an electrical device referred to in the present invention.
Figure 12:
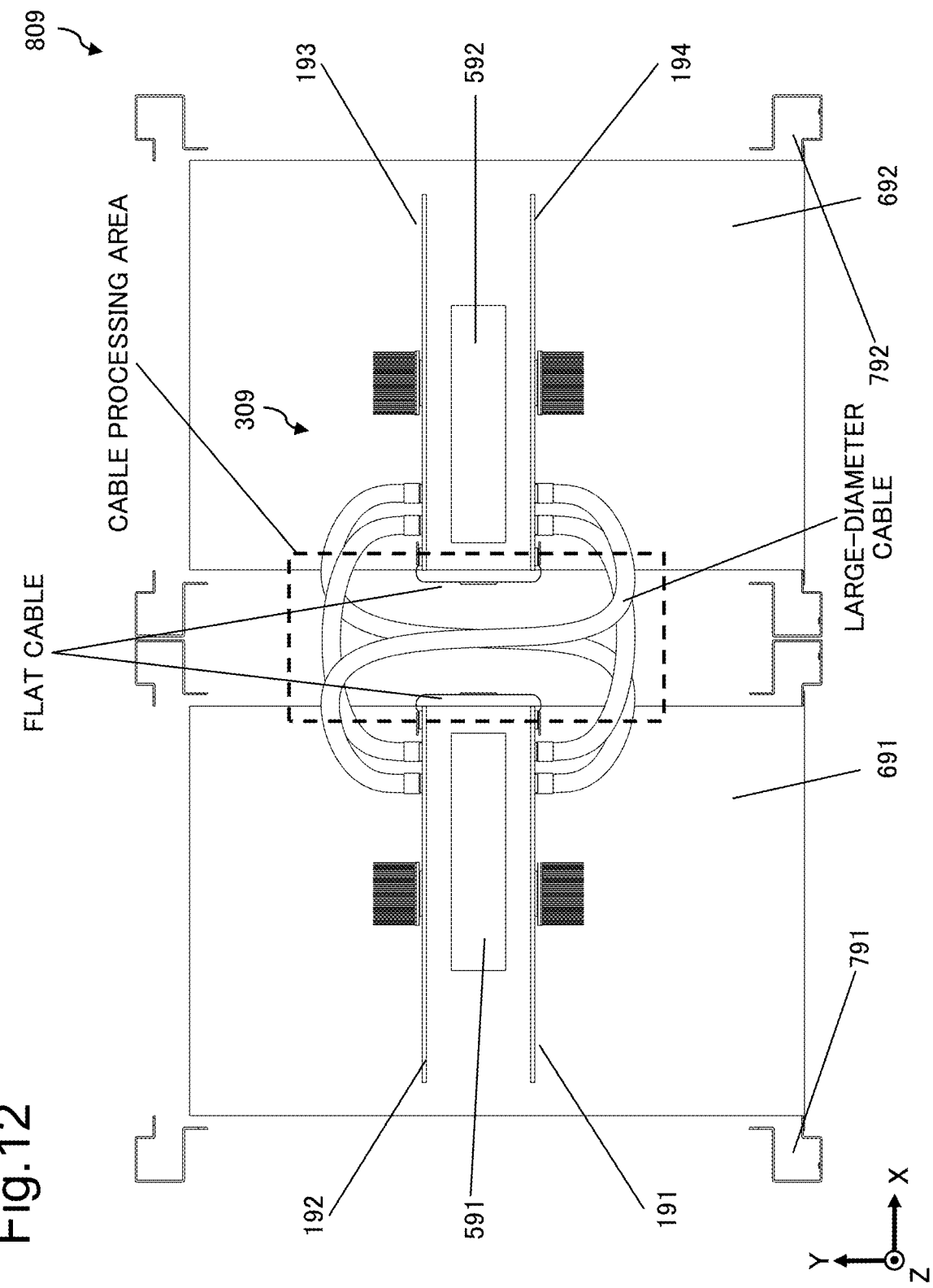
FIG. 12 is a top perspective view illustrating an example of the configuration of the electrical device referred to in the present invention.
Figure 14:
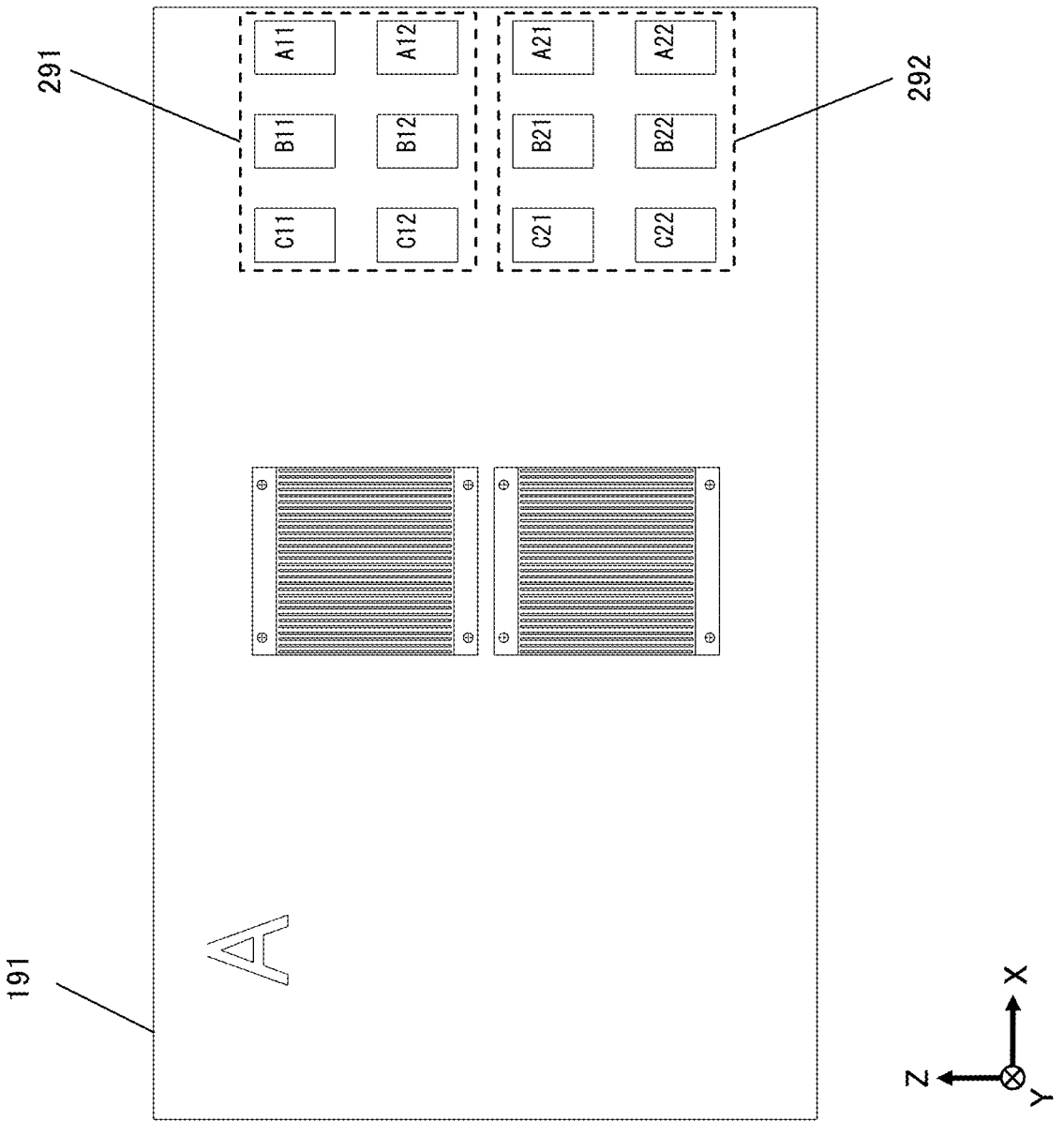
FIG. 14 is a front view illustrating an example of a configuration of a substrate included in the electrical device referred to in the present invention.

FIG. 10 is a top perspective view illustrating an example of the connection between the substrates by the flat cables in the third example embodiment of the present invention. A lower side of FIG. 10 is an enlarged view of the vicinity of the center of an upper side of FIG. 10. As illustrated in FIG. 10, four composite cables (referred to as "composite B cables") each including two flat cables B are bent at the crank portion. Four composite cables each including two flat cables C (referred to as "composite C cables") pass through a gap between the four composite B cables. Eight flat cables A are arranged on both left and right sides of an area where the flat cables B and C are arranged.

Operation in the present example embodiment will be described.

Operation of connecting the substrates 151, 152, 153, and 154 by the flat cables will be described.

First, between the substrates 151 and 152, all the connectors A are connected using four flat cables A. Similarly, between the substrates 153 and 154, all the connectors A are connected using four flat cables A.

Next, between the substrates 151 and 154, all the connectors B are connected using four flat cables B. Similarly, between the substrates 152 and 153, all the connectors B are connected using four flat cables B.

Subsequently, between the substrates 151 and 153, all the connectors C are connected using four flat cables C. Similarly, between the substrates 152 and 154, all the connectors C are connected using four flat cables C.

In this manner, by connecting the substrates 151, 152, 153, and 154 are connected using the eight flat cables A, the eight flat cables B, and the eight flat cables C, the substrates are connected by the flat cables.

As described above, in the electrical device 805 in the present example embodiment, the substrates 151, 152, 153, and 154 are connected using the eight flat cables A, the eight flat cables B, and the eight flat cables C. Therefore, the electrical device 805 in the present example embodiment has an effect that equal to or more than three substrates can be compactly interconnected by flat cables.

The electrical device 805 in the present example embodiment also has an effect that space saving can be achieved as a result of using the flat cables for the connection between the substrates as compared with a case where large-diameter cables are used. As a result, in the electrical device 805 in the present example embodiment, line lengths of the cables can be shortened. In the electrical device 805 in the present example embodiment, maintainability of the cables is also improved.

In the above description, a case where the number of connectors included in one substrate is 12 has been described as an example. However, in the electrical device 805 in the present example embodiment, it is sufficient that the number of connectors included in one substrate is a multiple of 6.

The present invention has been exemplarily described above with reference to each of the above example embodiments and modifications of the embodiments. However, a technical scope of the present invention is not limited to the scope described in each of the above example embodiments and modifications of the embodiments. It is obvious to those of ordinary skill in the art that various changes or improvements can be made to such example embodiments. In such a case, new example embodiments with such changes or improvements can also be included in the technical scope of the present invention. This is obvious from matters described in claims.

INDUSTRIAL APPLICABILITY

The present invention can be used for connection between equal to or more than three substrates by flat cables.

This application is based upon and claims the benefit of priority from Japanese patent application No. 2021-21397, filed on Feb. 15, 2021, the disclosure of which is incorporated herein in its entirety by reference.

REFERENCE SIGNS LIST

101, 111 First substrate
102, 112 Second substrate
103, 113 Third substrate
114 Fourth substrate
151, 152, 153, 154 Substrate
191, 192, 193, 194 Substrate
201 First connector
202 Second connector
203 Third connector
204 Fourth connector
205 Fifth connector
206 Sixth connector
211 Seventh connector

212 Eighth connector
213 Ninth connector
214 Tenth connector
215 Eleventh connector
216 Twelfth connector
251, 252 Connector group
291, 292 Connector group
300, 301, 305, 309 Composite substrate
401 First flat cable
402 Second flat cable
403 Third flat cable
414 Fourth flat cable
415 Fifth flat cable
416 Sixth flat cable
551, 552 Substrate holding unit
591, 592 Substrate holding unit
651, 652 Shelf
691, 692 Shelf
751, 752 Rack
791, 792 Rack
800, 801, 805, 809 Electrical device

What is claimed is:

1. A composite substrate comprising: a first substrate that includes a first connector and a second connector having width directions parallel to a first direction; a second substrate that includes a third connector and a fourth connector having width directions parallel to the first direction; a third substrate that includes a fifth connector and a sixth connector having width directions parallel to the first direction; a first flat cable that connects the first connector and the third connector; a second flat cable that connects the second connector and the fifth connector; and a third flat cable that connects the fourth connector and the sixth connector, wherein the second substrate and the third substrate are arranged parallel to the first substrate, wherein the second substrate and the third substrate are arranged to be superposed above the first substrate.

2. The composite substrate according to claim 1, further comprising
   a fourth substrate that includes a seventh connector, an eighth connector, and a ninth connector having width directions parallel to the first direction,
   wherein the first substrate further includes a tenth connector having a width direction parallel to the first direction,
   the second substrate further includes an eleventh connector having a width direction parallel to the first direction,
   the third substrate further includes a twelfth connector having a width direction parallel to the first direction, and
   a fourth flat cable that connects the seventh connector and the twelfth connector,
   a fifth flat cable that connects the eighth connector and the eleventh connector, and
   a sixth flat cable that connects the ninth connector and the tenth connector
   are included.

3. The composite substrate according to claim 2, wherein the second substrate, the third substrate, and the fourth substrate are arranged parallel to the first substrate.

4. The composite substrate according to claim 3, wherein the second substrate is arranged to be superposed above the first substrate, and
   the fourth substrate is arranged to be superposed above the third substrate.

5. The composite substrate according to claim 4, wherein the third substrate is arranged to be superposed above the second substrate.

6. The composite substrate according to claim 2, wherein each of the substrates have the same outer shape and the same connector arrangement.

7. The composite substrate according to claim 1, wherein each of the substrates have the same outer shape and the same connector arrangement.

8. An electrical device comprising the composite substrate according to claim 1.

* * * * *